(12) United States Patent
Sayilir et al.

(10) Patent No.: US 10,158,387 B1
(45) Date of Patent: Dec. 18, 2018

(54) FREQUENCY DOWN-CONVERTER WITH HIGH IMMUNITY TO BLOCKER AND METHOD THEREOF

(71) Applicant: Realtek Semiconductor Corp., Hsinchu (TW)

(72) Inventors: Serkan Sayilir, San Jose, CA (US); Poh Boon Leong, Pleasanton, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/991,183

(22) Filed: May 29, 2018

(51) Int. Cl.
| | |
|---|---|
| *H03D 7/14* | (2006.01) |
| *H03F 1/34* | (2006.01) |
| *H04B 1/10* | (2006.01) |
| *H04B 1/30* | (2006.01) |

(52) U.S. Cl.
CPC ............ *H04B 1/1018* (2013.01); *H03D 7/14* (2013.01); *H03F 1/34* (2013.01); *H04B 1/30* (2013.01)

(58) Field of Classification Search
CPC .......... H04B 1/1018; H04B 1/30; H03D 7/14; H03F 1/34
See application file for complete search history.

(56) References Cited

U.S. PATENT DOCUMENTS

| | | | | |
|---|---|---|---|---|
| 2011/0124307 A1* | 5/2011 | Balankutty | .............. | H04B 1/12 455/296 |
| 2015/0295554 A1* | 10/2015 | Heikkinen | ........... | H03G 3/3042 327/355 |
| 2017/0244375 A1* | 8/2017 | Oshima | .................. | H03H 19/00 |

* cited by examiner

*Primary Examiner* — Nguyen T Vo
(74) *Attorney, Agent, or Firm* — McClure, Qualey & Rodack, LLP

(57) ABSTRACT

An frequency down-converter includes a mixer configured to receive a RF (radio frequency) signal having a first end and a second end and output an intermediate signal comprising a first end and a second end in accordance with a LO (local oscillator) signal having a first end and a second end, wherein the first end and the second end of the LO signal jointly form a two-phase periodic signal of a fundamental frequency approximately equal to a mean frequency of a desired component of the RF signal. The down-converter further includes an opamp (operational amplifier) configured to receive the intermediate signal and output an output signal having a first end and a second end; a first feedback network configured to couple the second end of the output signal to the first end of the intermediate signal; a second feedback network configured to couple the first end of the output signal to the second end of the intermediate signal; and an auxiliary mixer configured to receive the RF signal and provide a supplemental signal added to the output signal in accordance with the LO signal. Preferably, the auxiliary mixer is based on using the same circuit as the mixer but replacing each switch in the mixer with a switch in series with a capacitor.

19 Claims, 5 Drawing Sheets

FREQUENCY DOWN-CONVERTER WITH HIGH IMMUNITY TO BLOCKER AND METHOD THEREOF

BACKGROUND OF THE INVENTION

Field of the Invention

The present invention generally relates to frequency-down-converters, and more particularly to down-converter circuits and methods having improved linearity and dynamic range.

Description of Related Art

As depicted in FIG. 1A, a conventional frequency down-converter 100 comprises: a mixer 110 configured to receive a RF (radio frequency) signal comprising a first end $V_{RF+}$ and a second end $V_{RF-}$ and output an intermediate signal comprising a first end $V_{X+}$ and a second end $V_{X-}$ in accordance with a control by a LO (local oscillator) signal comprising a first end $V_{LO+}$ and a second end $V_{LO-}$; an opamp (operational amplifier) 120 configured to receive the intermediate signal and output an IF (intermediate frequency) signal comprising a first end $V_{IF+}$ and a second end $V_{IF-}$; a first feedback network 130 configured to provide a feedback coupling between $V_{IF-}$ and $V_{X+}$; and a second feedback network 140 configured to provide a feedback coupling between $V_{IF+}$ and $V_{X-}$.

As shown in callout box COB110, mixer 110 comprises: a first (second, third, fourth) switch 111 (112, 113, 114) configured to connect $V_{RF+}$ ($V_{RF-}$, $V_{RF+}$, $V_{RF-}$) to $V_{X+}$ ($V_{X+}$, $V_-$, $V_{X-}$) when $V_{LO+}$ ($V_{LO-}$, $V_{LO-}$, $V_{LO+}$) is asserted. As shown in callout box COB130, feedback network 130 comprises a parallel connection of a capacitor 131 and a resistor 132. Feedback network 140 is embodied using the same circuit as feedback network 130 but replacing $V_{X+}$ and $V_{IF-}$ therein with $V_{X-}$ and $V_{IF+}$, respectively. Conventional frequency down-converter 100 is well known to those of ordinary skill in the art and thus not described in detail here.

Conventional frequency down-converter 100 is often used in a zero-IF receiver, wherein a mean frequency of a desired component of the RF signal is exactly or at least approximately equal to a fundamental frequency of the LO signal. In this case, a desired component in the IF signal has a low-pass nature and is often referred to as a BB (baseband) signal. In a zero-IF receiver, two frequency down-converters and two LO signals including an in-phase signal and a quadrature signal are needed: one of the two frequency down-converters uses the in-phase signal, while the other uses the quadrature signal. Concepts of "zero-IF receiver," "in-phase," and "quadrature" are well understood to those of ordinary skills in the art and thus not described in detail here.

In a receiver, the RF signal (represented by $V_{RF+}$ and $V_{RF-}$ in the frequency down-converter 100 of FIG. 1A) often contains an undesired component referred to as a "blocker" besides the desired component. The blocker differs from the desired component in frequency but is down converted along with the desired component. The blocker can be highly detrimental. First, the blocker can adversely degrade a linearity of the mixer 110 and the opamp 120 and thus distort the desired component in the IF signal. Second, the blocker can adversely reduce a dynamic range available for the desired component of signal in the opamp 120 and subsequent circuits. Although feedback networks 130 and 140 can provide a low-pass filtering function that can somewhat attenuate the undesired component and alleviate the dynamic range issue, the low-pass corner and thus the effectiveness of the filtering are constrained by the need to preserve the integrity of the desired component. Also, feedback networks 130 and 140 cannot effectively alleviate the linearity issue.

To deal with the blocker, a band-pass filter 150 shown in FIG. 1B can be used to attenuate the blocker of the RF signal in a zero-IF receiver. Band-pass filter 150 comprises four switches 151, 152, 153, and 154, and four capacitors 155, 156, 157, and 158. Switch 151 (152) is used to shunt $V_{RF+}$ to ground via capacitor 155 (156) when $V_{LO+}$ ($V_{LO-}$) is asserted. Switch 153 (154) is used to shunt $V_{RF-}$ to ground via capacitor 157 (158) when $V_{LO+}$ ($V_{LO-}$) is asserted. Band-pass filter 150 belongs to a category of filters known as "N-path filter" in the prior art. Principles of N-path filters can be learned by reading the paper "N-path filters and mixer-first receivers: A review" presented by Klumperink et al in Custom Integrated Circuits Conference (CICC), 2017, IEEE. Briefly speaking, the band-pass filter 150 embodies an impedance that is approximately inversely proportional to a frequency difference between the RF signal and the LO signal. As such, the band-pass filter 150 is of a high impedance to the desired component (of the RF signal), but of a low impedance to the undesired component (of the RF signal). The blocker can thus be effectively shunted to ground and attenuated.

Although band-pass filter 150 can attenuate the blocker, there are two issues or drawbacks to this configuration. First, the four capacitors 155, 156, 157, and 158 usually are quite large and occupy a large physical area in an integrated circuits chip. Second, the band-pass filter 150 has a finite impedance and thus also partly shunt the desired component to ground and thus introduce a loss to the desired component of the RF signal. The loss is usually non-negligible.

Accordingly, it is desired to implement a down-converter circuit configuration that overcomes these shortcomings of conventional systems.

BRIEF SUMMARY OF THIS INVENTION

What is disclosed is a method for alleviating the linearity and dynamic range issues caused by a blocker without using a large area nor causing a non-negligible loss to the desired component of the RF signal.

In an embodiment, a frequency down-converter comprises: a mixer configured to receive a RF (radio frequency) signal comprising a first end and a second end and output an intermediate signal comprising a first end and a second end in accordance with a LO (local oscillator) signal comprising a first end and a second end, wherein the first end and the second end of the LO signal jointly form a two-phase periodic signal of a fundamental frequency approximately equal to a mean frequency of a desired component of the RF signal; an opamp (operational amplifier) configured to receive the intermediate signal and output an output signal comprising a first end and a second end; a first feedback network configured to couple the second end of the output signal to the first end of the intermediate signal; a second feedback network configured to couple the first end of the output signal to the second end of the intermediate signal; and an auxiliary mixer configured to receive the RF signal and provide a supplemental signal added to the output signal in accordance with the LO signal, wherein: the auxiliary mixer is based on using the same circuit topology as the mixer but replacing each switch in the mixer with a switch in series with a capacitor.

In an embodiment, a method comprises: receiving a RF (radio frequency) signal comprising a first end and a second end; receiving a LO (local oscillator) signal comprising a first end and a second end, wherein the first end and the second end of the LO signal jointly form a two-phase periodic signal of a fundamental frequency approximately equal to a mean frequency of a desired component of the RF signal; mixing the RF signal with the LO signal using a mixer to output an intermediate signal comprising a first end and a second end; converting the intermediate signal into an output signal comprising a first end and a second end using an opamp (operational amplifier) with a negative feedback via a first feedback network and a second feedback network; and mixing the RF signal with the LO signal using an auxiliary mixer to establish a supplementary signal added to the output signal as a supplement, wherein: the auxiliary mixer is based on using the same circuit topology as the mixer but replacing each switch in the mixer with a switch in series with a capacitor.

DETAILED DESCRIPTION OF THIS INVENTION

The present invention relates to frequency down-converters. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "signal," "network," "capacitor," "resistor," "switch," "feedback," "negative feedback," "opamp (operational amplifier)," "buffer," and "integrator." Terms and basic concepts like these are apparent and understood to those of ordinary skill in the art and thus will not be explained in detail here.

Throughout this disclosure, a switch is a device used for conditionally connecting a first signal to a second signal in accordance with a state of a control signal. The control signal has two states: an "asserted" state and a "de-asserted" state. When the control signal is "asserted," the switch is turned on and the first signal and the second signal are effectively connected by the switch. When the control signal is "de-asserted," the switch is turned off and the first signal and the second signal are not connected by the switch.

Throughout this disclosure, a differential signal is a composite signal that comprises a first constituent signal and a second constituent signal. The first constituent signal is referred to as a first end, while the second constituent signal is referred to as a second end.

Figure 2:
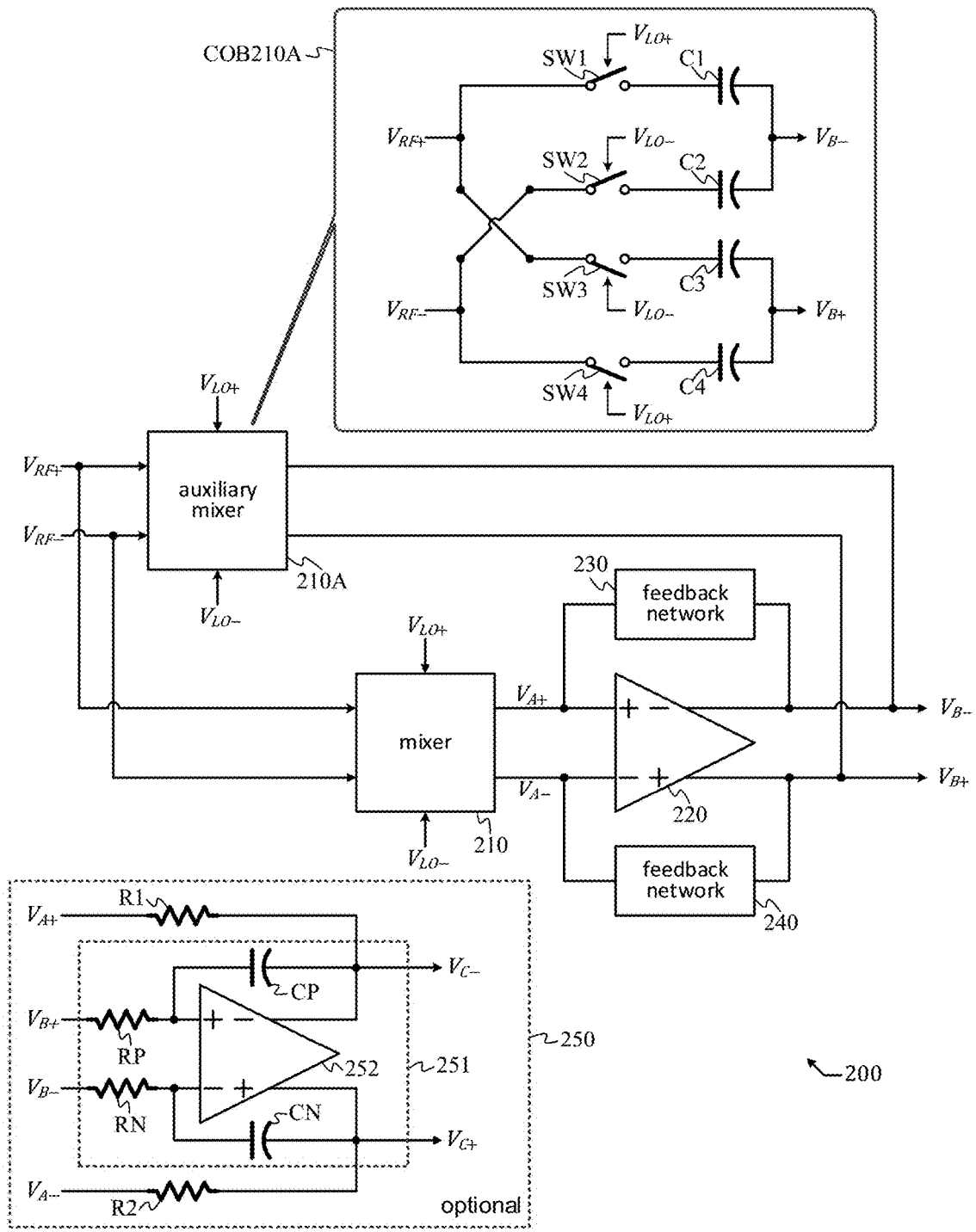
FIG. 2 shows a functional block diagram of frequency down-converter in accordance with and embodiment of the present invention

A functional block diagram of a frequency down-converter 200 in accordance with an embodiment of the present invention is shown in FIG. 2. Frequency down-converter 200 comprises: a mixer 210 configured to receive a RF (radio frequency) signal comprising a first end $V_{RF+}$ and a second end $V_{RF-}$ and output an intermediate signal comprising a first end $V_{A+}$ and a second end $V_{A-}$ in accordance with a control by a LO (local oscillator) signal comprising a first end $V_{LO+}$ and a second end $V_{LO-}$; an opamp (operational amplifier) 220 configured to receive the intermediate signal ($V_{A+}$ and $V_{A-}$) and output an output signal comprising a first end $V_{B+}$ and a second end $V_{B-}$; a first feedback network 230 configured to provide a feedback coupling between $V_{B-}$ and $V_{A+}$; a second feedback network 240 configured to provide a feedback coupling between $V_{B+}$ and $V_{A-}$; and an auxiliary mixer 210A configured to provide an capacitive coupling between the RF signal ($V_{RF+}$ and $V_{RF-}$) and the output signal ($V_{B-}$ and $V_{B+}$) in accordance with a control by the LO signal ($V_{LO+}$ and $V_{LO-}$).

$V_{LO+}$ and $V_{LO-}$ form a 2-phase periodic signal that mathematically satisfies the following equation:

$$V_{LO-}(t) = V_{LO+}(t - T/2) \quad (1)$$

Here, t denotes a time variable, T is a fundamental period of the 2-phase periodic signal, and 1/T is approximately equal to a mean frequency of a desired component of the RF signal. In an embodiment, both $V_{LO+}(t)$ and $V_{LO-}(t)$ are approximately a square wave cyclically toggling back and forth between a first level and a second level. When $V_{LO+}(t)$ is at the first level, it is said to be "asserted," otherwise it is said to be "de-asserted." The same thing can be said about $V_{LO-}(t)$. A duty cycle of $V_{LO+}(t)$ is a percentage of time that $V_{LO+}(t)$ is "asserted." The same thing can be said about $V_{LO-}(t)$. In an embodiment, both $V_{LO+}(t)$ and $V_{LO-}(t)$ have approximately a 25% duty cycle. In another embodiment, both $V_{LO+}(t)$ and $V_{LO-}(t)$ (t) have approximately a 50% duty cycle. In a yet another embodiment, both $V_{LO+}(t)$ and $V_{LO-}(t)$ (t) have approximately a 33% duty cycle.

Figure 1A:
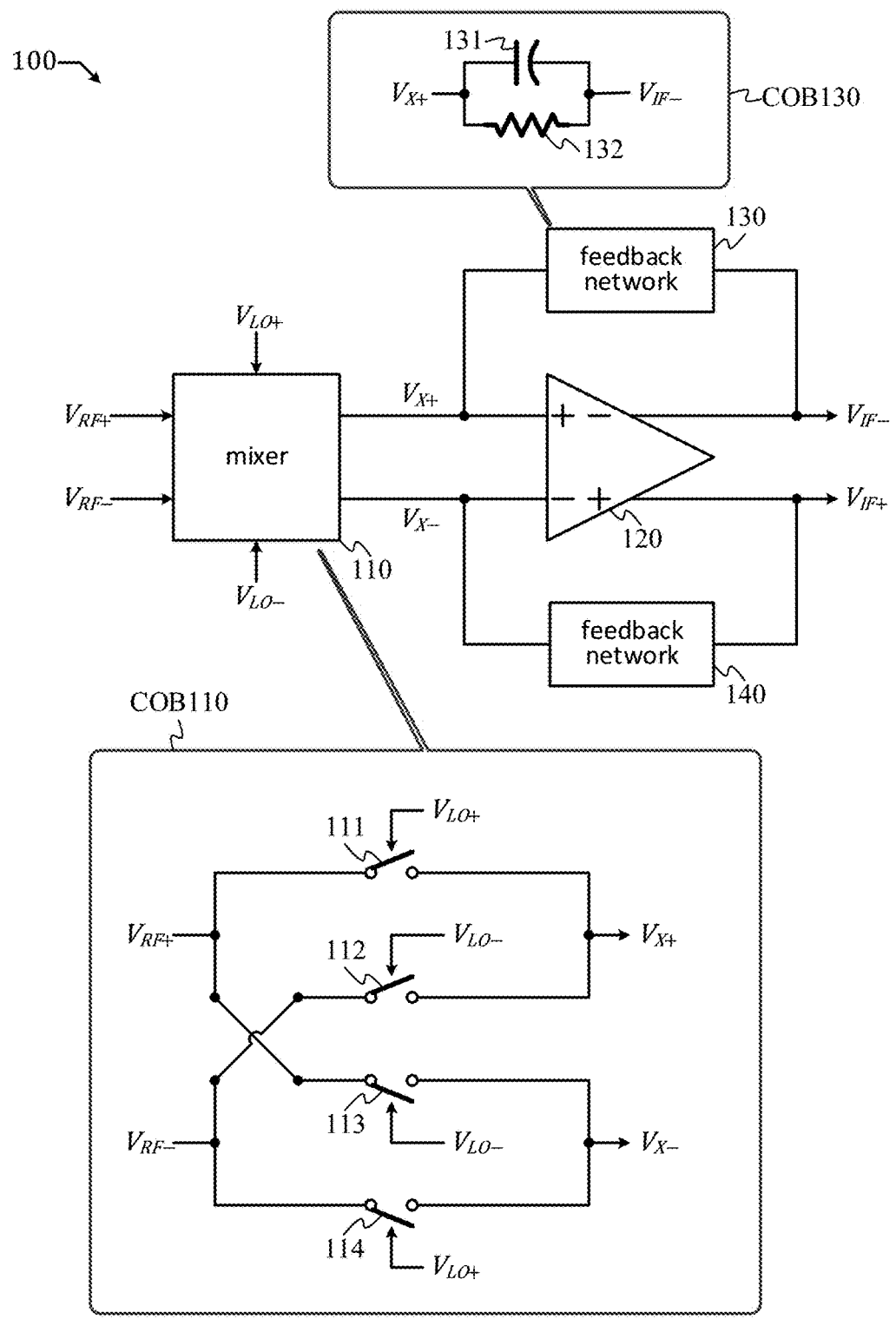
FIG. 1A shows a schematic diagram of a conventional frequency down-converter.

In an embodiment, mixer 210 is embodied by using the circuit shown in callout box COB110 in FIG. 1. (The signal labeling therein needs to be changed, i.e. "$V_{X+}$" and "$V_{X-}$" need to be replaced with "$V_{A+}$" and "$V_{A-}$," respectively).

In an embodiment shown in callout box COB210A, auxiliary mixer 210A comprises: a first (second, third, fourth) switch SW1 (SW2, SW3, SW4) configured to connect "$V_{RF+}$" ("$V_{RF-}$," "$V_{RF+}$," "$V_{RF-}$") to the "$V_{B-}$" ("$V_{B-}$," "$V_{B+}$," "$V_{B+}$") via a first (second, third, fourth) capacitor C1 (C2, C3, C4) when "$V_{LO+}$" ("$V_{LO-}$," "$V_{LO-}$," "$V_{LO+}$") is asserted. As far as circuit topology is concerned, auxiliary mixer 210A is of the same circuit topology as mixer 210 except for further including capacitors C1, C2, C3, and C4 for a purpose of capacitive coupling. As far as signal interaction is concerned, mixer 210 is configured to couple the RF signal ($V_{RF+}$ and $V_{RF-}$) to the intermediate signal ($V_{A+}$ and $V_{A-}$), while auxiliary mixer 210A is configured to coupling the RF signal ($V_{RF+}$ and $V_{RF-}$) to the output signal ($V_{B-}$ and $V_{B+}$).

In an embodiment, both feedback networks 230 and 240 are embodied using the circuit shown in callout box COB130 in FIG. 1. (The signal labeling should be changed to match the application of the circuit, e.g. replacing "$V_{X+}$" and "$V_{IF-}$" with "$V_{A+}$" and "$V_{B-}$"). In another embodiment, both feedback networks 230 and 240 are embodied using the circuit shown in callout box COB130 in FIG. 1 but removing resistor 132 therein.

In an optional embodiment, frequency down-converter 200 further includes an additional network 250 comprising an integrator 251, a first resistor R1, and a second R2. Integrator 251 comprises an opamp 252, two feed-in resistors RP and RN, and two feedback capacitors CP and CN. The purpose of using the additional network 250 will be explained later. Excluding the additional network 250, frequency down-converter 200 is the same as the conventional frequency converter 100 of FIG. 1A except for the addition of the auxiliary mixer 210A. Auxiliary mixer 210A effectively embodies a band-pass filter that can suppress a blocker component of the RF signal. Unlike the conventional N-path filter 150 in FIG. 1B that uses capacitors to shunt a RF signal to ground in accordance with a LO signal, the auxiliary mixer 210A uses capacitors (i.e. C1, C2, C3, and C4) to shunt the RF signal (i.e. $V_{RF+}$ and $V_{RF-}$) to the output of the opamp 220 (i.e. $V_{B-}$ and $V_{B+}$) in accordance with the LO signal ($V_{LO+}$ and $V_{LO-}$). Since the opamp 220 can provide an inverting gain and thus boost the output signal ($V_{B-}$ and $V_{B+}$), the auxiliary mixer 210A can shunt more current from the RF signal than the conventional N-path filter 150 in FIG. 1B, based on using the same switches and capacitors. This is a principle known as "Miller effect." This allows the use of a capacitance value (for capacitors C1, C2, C3, and C4) smaller than what is used in the conventional N-path filter 150 in FIG. 1B, yet achieve the same current shunting capability and thus filtering performance.

Figure 1B:
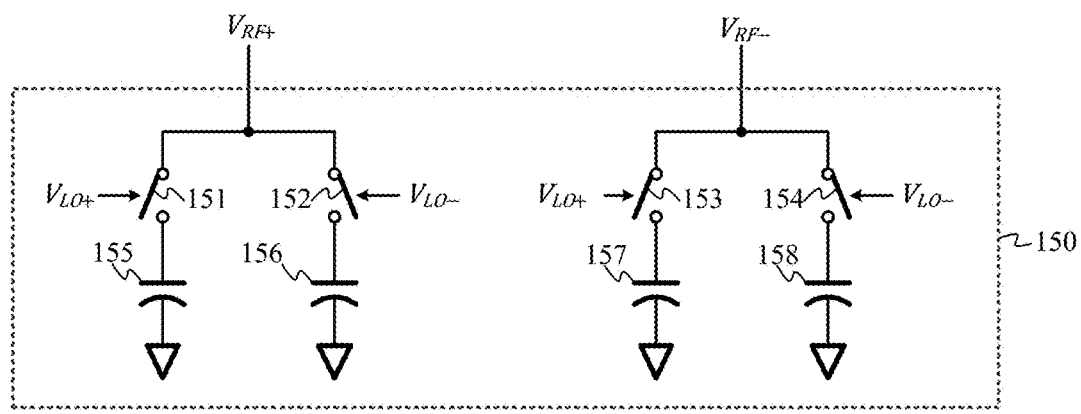
FIG. 1B shows a schematic diagram of a band-pass filter.

In addition, unlike the conventional N-path 150 in FIG. 1B that will inevitably partly shunt the desired component of the RF signal to ground, the auxiliary mixer 210A will inevitably partly shunt the desired component of the RF signal to the output of the opamp 220. However, a frequency down-conversion takes place along with the shunt action, therefore the part of the desired component of the RF signal that is shunt by the auxiliary mixer 210A is down converted and becomes a part of a desirable component of the output signal. In other words, for the desired component of the RF signal, the auxiliary mixer 210A merely provides an alternative path to get to the output of the opamp 220 (besides going straight through the mixer 210 and the opamp 220 with feedback networks 230 and 240). Therefore, there is almost no loss to the desired component. Auxiliary mixer 210A, therefore, resolves both the large capacitance and the signal loss issues of the band-pass filter 150 in FIG. 1B.

The additional network 250 is configured to receive the output signal (i.e. $V_{B+}$ and $V_{B-}$) and output a filtered signal comprising a first end $V_{C+}$ and a second end $V_{C-}$ using integrator 251. Opamp 220, integrator 251, along with feedback networks 230 and 240 and resistors R1 and R2 form a biquad filter that can provide a second order low-pass filtering function. Biquad filters are well known to those of ordinary skills in the art and thus not described in detail here. It is well known to persons stilled in the art that an integrator (such as integrator 251) can be embodied using an opamp (such as opamp 252) along with two feed-in resistors (such R1 and R2) and two feedback capacitors (such as CP and CN). Therefore, this is not described in detail herein.

Figure 3:
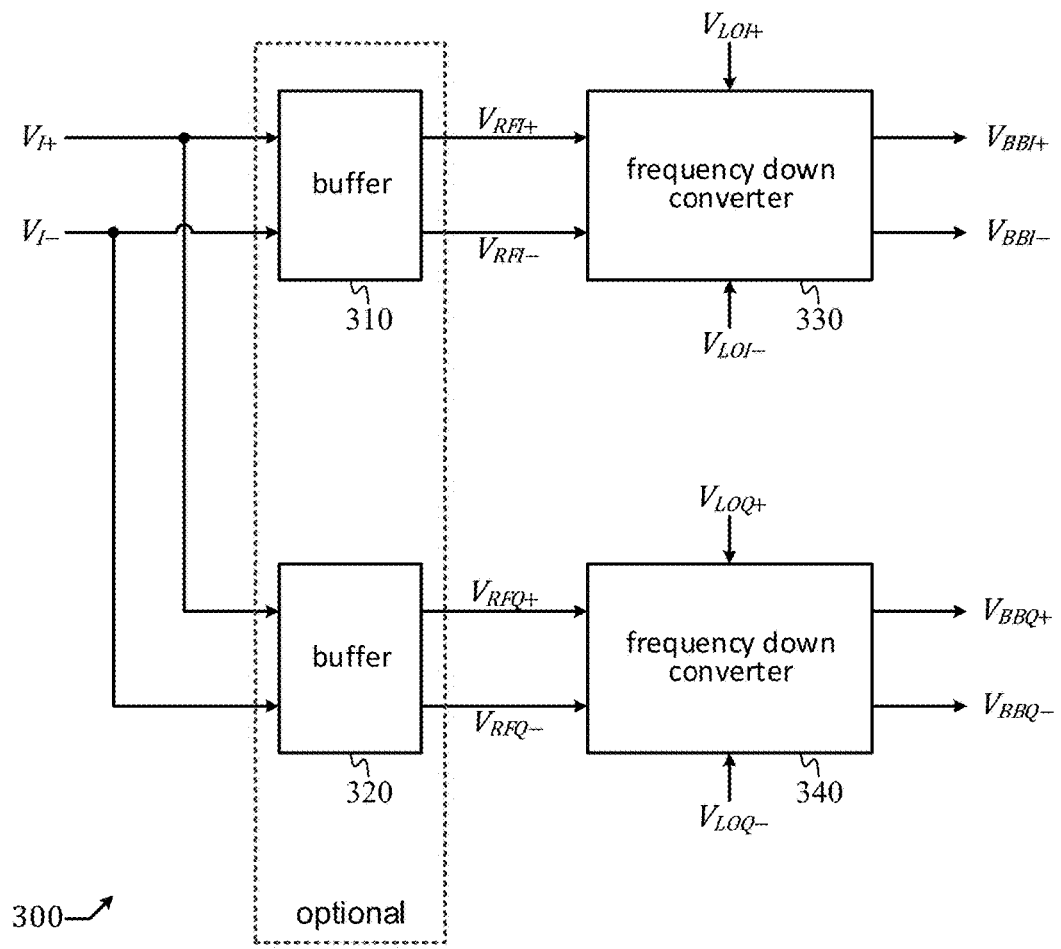
FIG. 3 shows a functional block diagram of a zero-IF receiver.

A functional block diagram of a zero-IF receiver 300 is shown in FIG. 3. Zero-IF receiver 300 comprises: a first buffer 310 configured to receive an input RF signal comprising a first end $V_{I+}$ and a second end $V_{I-}$ and output a first buffered signal comprising a first end $V_{RFI+}$ and a second end $V_{RFI-}$; a second buffer 320 configured to receive the input RF signal and output a second buffered signal comprising a first end $V_{RFQ+}$ and a second end $V_{RFQ-}$; a first frequency down-converter 330 configured to receive the first buffered signal and output an in-phase baseband signal comprising a first end $V_{BBI+}$ and a second end $V_{BBI-}$ in accordance with an in-phase LO signal comprising a first end $V_{LOI+}$ and a second end $V_{LOI-}$; and a second frequency down-converter 340 configured to receive the second buffered signal and output a quadrature baseband signal comprising a first end $V_{BBQ+}$ and a second end $V_{BBQ-}$ in accordance with a quadrature LO signal comprising a first end $V_{LOQ+}$ and a second end $V_{LOQ-}$.

Both the first frequency down-converter 330 and the second frequency down-converter 340 are embodied using frequency down-converter 200 of FIG. 2. When embodying the first frequency down-converter 330, one replaces $V_{RF+}$, $V_{RF-}$, $V_{LO+}$, and $V_{LO-}$ with $V_{RFI+}$, $V_{RFI-}$, $V_{LOI+}$, and $V_{LOI-}$, respectively, and replaces $V_{C+}$ and $V_{C-}$ with $V_{BBI+}$ and $V_{BBI-}$, respectively, if the additional network 250 is included, or otherwise replaces $V_{B+}$ and $V_{B-}$ with $V_{BBI+}$ and $V_{BBI-}$, respectively. Likewise, when embodying the second frequency down-converter 340, one replaces $V_{RF+}$, $V_{RF-}$, $V_{LO+}$, and $V_{LO-}$ with $V_{RFQ+}$, $V_{RFQ-}$, $V_{LOQ+}$, and $V_{LOQ-}$, respectively, and replaces $V_{C+}$ and $V_{C-}$ with $V_{BBQ+}$ and $V_{BBQ-}$, respectively, if the additional network 250 is included, or otherwise replaces $V_{B+}$ and $V_{B-}$ with $V_{BBQ+}$ and $V_{BBQ-}$, respectively. $V_{LOI+}$, $V_{LOQ+}$, $V_{LOI-}$, and $V_{LOQ-}$ form a 4-phase periodic signal that mathematically satisfies the following equations:

$$V_{LOQ+}(t) = V_{LOI+}(t-T/4) \qquad (2)$$

$$V_{LOI-}(t) = V_{LOQ+}(t-T/4) \qquad (3)$$

$$V_{LOQ-}(t) = V_{LOI-}(t-T/4) \qquad (4)$$

Here, t denotes a time variable, T is a fundamental period of the 4-phase periodic signal, and 1/T is approximately equal to a mean frequency of a desired component of the input RF signal. In an embodiment, $V_{LOI+}(t)$, $V_{LOQ+}(t)$, $V_{LOI-}(t)$, and $V_{LOQ-}(t)$ are all approximately a square wave cyclically toggling back and forth between a first level and a second level. When $V_{LOI+}(t)$ is at the first level, it's said to be "asserted," otherwise it's said to be "de-asserted." The same thing can be said about $V_{LOQ+}(t)$, $V_{LOI-}(t)$, and $V_{LOQ-}(t)$. A duty cycle of $V_{LOI+}(t)$ is a percentage of time that $V_{LOI+}(t)$ is "asserted." The same thing can be said about $V_{LOQ+}(t)$, $V_{LOI-}(t)$, and $V_{LOQ-}(t)$. In an embodiment, $V_{LOI+}(t)$, $V_{LOQ+}(t)$, $V_{LOI-}(t)$, and $V_{LOQ-}$ all have approximately a 25% duty cycle. In another embodiment, $V_{LOI+}(t)$, $V_{LOQ+}(t)$, $V_{LOI-}(t)$, and $V_{LOQ-}$ all have approximately a 50% duty cycle. In a yet another embodiment, $V_{LOI}(t)$, $V_{LOQ+}(t)$, $V_{LOI-}(t)$, and $V_{LOQ-}$ all have approximately a 33% duty cycle.

Buffers 310 and 320 provide an isolation between frequency down-converters 330 and 340, but they are optional. When buffers 310 and 320 are not used, both $V_{RFI+}$ and $V_{RFQ+}$ are the same as $V_{I+}$, while $V_{RFI-}$ and $V_{RFQ-}$ are the same as $V_{I-}$. It is preferred that buffers 310 and 320 are used when $V_{LOI+}(t)$, $V_{LOQ+}(t)$, $V_{LOI-}(t)$, and $V_{LOQ-}(t)$ have approximately a 50% duty cycle to avoid a potentially adverse coupling between frequency down-converters 330 and 340. A buffer is a circuit that provides a good reverse isolation and is well understood by those of ordinary skills in the art and thus not described in detail here.

Figure 4:
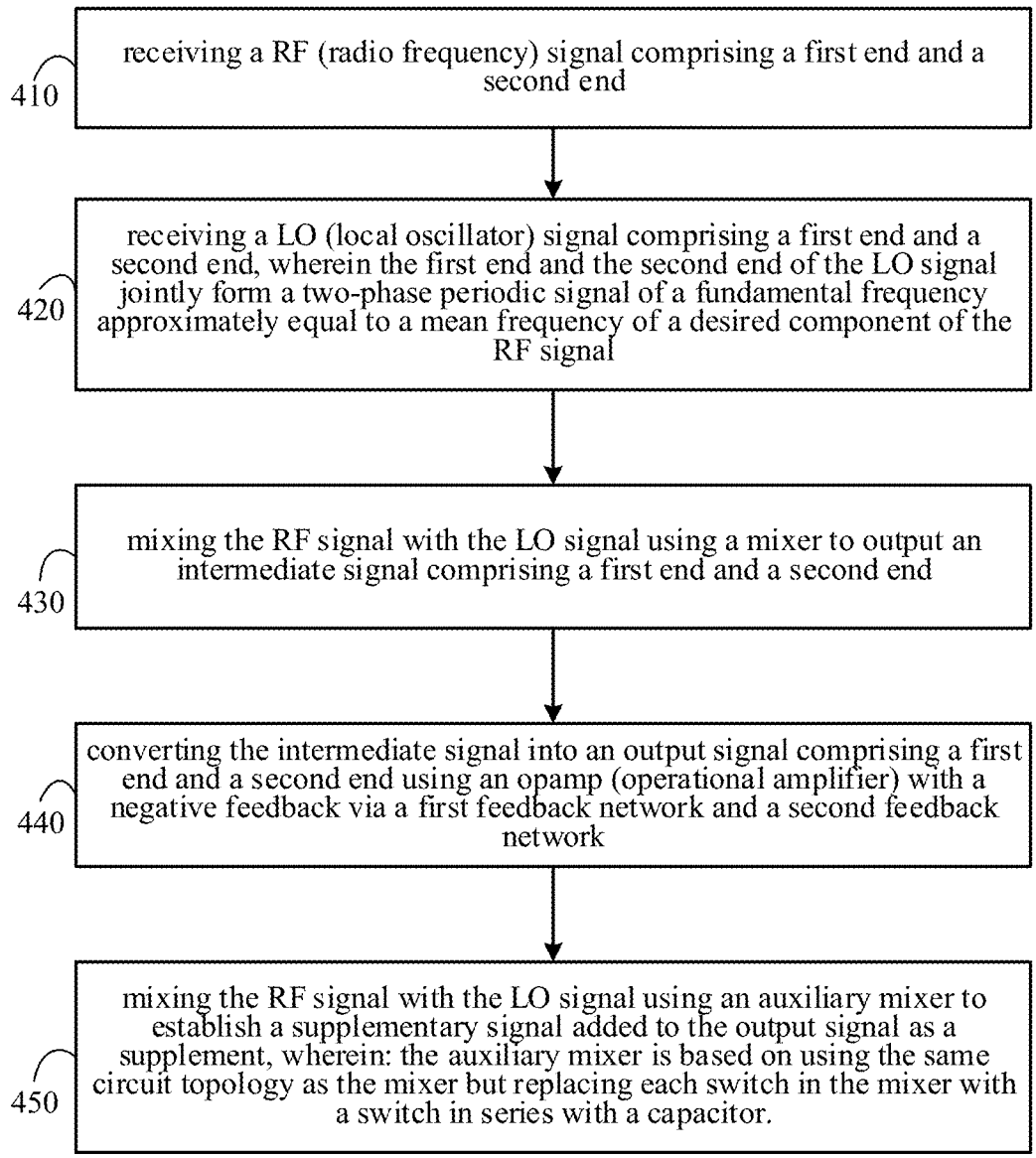
FIG. 4 shows a flow diagram of a method in accordance with an embodiment of the present invention.

As illustrated by a flow diagram shown in FIG. 4, a method in accordance with an embodiment of the present invention comprises: (step 410) receiving a RF (radio frequency) signal comprising a first end and a second end; (step 420) receiving a LO (local oscillator) signal comprising a first end and a second end, wherein the first end and the second end of the LO signal jointly form a two-phase periodic signal of a fundamental frequency approximately equal to a mean frequency of a desired component of the RF signal; (step 430) mixing the RF signal with the LO signal using a mixer to output an intermediate signal comprising a first end and a second end; (step 440) converting the intermediate signal into an output signal comprising a first end and a second end using an opamp (operational amplifier) with a negative feedback via a first feedback network and a second feedback network; and (step 450) mixing the RF signal with the LO signal using an auxiliary mixer to establish a supplementary signal added to the output signal as a supplement, wherein: the auxiliary mixer is based on using the same circuit topology as the mixer but replacing each switch in the mixer with a switch in series with a capacitor.

Embodiments of the present invention can also be applied to a low-IF receiver, wherein a frequency difference between a LO signal and a desired component of a RF signal is not zero, but substantially smaller than a fundamental frequency of the LO signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency down-converter comprising:
   a mixer configured to receive a RF (radio frequency) signal comprising a first end and a second end and output an intermediate signal comprising a first end and a second end in accordance with a LO (local oscillator) signal comprising a first end and a second end, wherein the first end and the second end of the LO signal jointly form a two-phase periodic signal of a fundamental frequency approximately equal to a mean frequency of a desired component of the RF signal;
   an opamp (operational amplifier) configured to receive the intermediate signal and output an output signal comprising a first end and a second end;
   a first feedback network configured to couple the second end of the output signal to the first end of the intermediate signal; a second feedback network configured to couple the first end of the output signal to the second end of the intermediate signal; and
   an auxiliary mixer configured to receive the RF signal and provide a supplemental signal added to the output signal in accordance with the LO signal, wherein: the auxiliary mixer is based on using the same circuit topology as the mixer but replacing each switch in the mixer with a switch in series with a capacitor.

2. The frequency down-converter of claim 1, wherein the mixer comprises: a first switch configured to connect the first end of the RF signal to the first end of the intermediate signal when the first end of the LO signal is asserted; a second switch configured to connect the second end of the RF signal to the first end of the intermediate signal when the second end of the LO signal is asserted; a third switch configured to connect the first end of the RF signal to the second end of the intermediate signal when the second end of the LO signal is asserted; and a fourth switch configured to connect the second end of the RF signal to the second end of the intermediate signal when the first end of the LO signal is asserted.

3. The frequency down-converter of claim 1, wherein the auxiliary mixer comprises: a first switch in series with a first capacitor configured to capacitively couple the first end of the RF signal to the second end of the output signal when the first end of the LO signal is asserted; a second switch in series with a second capacitor configured to capacitively couple the second end of the RF signal to the second end of the output signal when the second end of the LO signal is asserted; a third switch in series with a third capacitor configured to capacitively couple the first end of the RF signal to the first end of the output signal when the second end of the LO signal is asserted; and a fourth switch in series with a fourth capacitor configured to capacitively couple the second end of the RF signal to the first end of the output signal when the first end of the LO signal is asserted.

4. The frequency down-converter of claim 1, wherein the first feedback network comprises a parallel connection of a feedback resistor and a feedback capacitor.

5. The frequency down-converter of claim 1, wherein the second feedback network comprises a parallel connection of a feedback resistor and a feedback capacitor.

6. The frequency down-converter of claim 1 further comprising an integrator configured to receive the output signal and output a filtered signal comprising a first end and a second end, a first feedback resistor configured to provide a feedback from the second end of the filtered signal to the first end of the intermediate signal, and a second feedback resistor configured to provide a feedback from the first end of the filtered signal to the second end of the intermediate signal.

7. The frequency down-converter if claim 6, wherein the integrator comprises another opamp, two feed-in resistors, and two feedback capacitors.

8. The frequency down-converter of claim 1, wherein the LO signal is approximately a square wave of an approximately 25% duty cycle.

9. The frequency down-converter of claim 1, wherein the LO signal is approximately a square wave of an approximately 50% duty cycle.

10. The frequency down-converter of claim 1, wherein the frequency down-converter is incorporated in a zero-IF (intermediate frequency) receiver.

11. A method comprising:
    receiving a RF (radio frequency) signal comprising a first end and a second end;
    receiving a LO (local oscillator) signal comprising a first end and a second end, wherein the first end and the second end of the LO signal jointly form a two-phase periodic signal of a fundamental frequency approximately equal to a mean frequency of a desired component of the RF signal;
    mixing the RF signal with the LO signal using a mixer to output an intermediate signal comprising a first end and a second end;
    converting the intermediate signal into an output signal comprising a first end and a second end using an opamp (operational amplifier) with a negative feedback via a first feedback network and a second feedback network; and
    mixing the RF signal with the LO signal using an auxiliary mixer to establish a supplementary signal added to the output signal as a supplement, wherein: the auxiliary mixer is based on using the same circuit topology as the mixer but replacing each switch in the mixer with a switch in series with a capacitor.

12. The method of claim 11, wherein the mixer comprises: a first switch configured to connect the first end of the RF signal to the first end of the intermediate signal when the first end of the LO signal is asserted; a second switch configured to connect the second end of the RF signal to the first end of the intermediate signal when the second end of the LO signal is asserted; a third switch configured to connect the first end of the RF signal to the second end of the intermediate signal when the second end of the LO signal is asserted; and a fourth switch configured to connect the second end of the RF signal to the second end of the intermediate signal when the first end of the LO signal is asserted.

13. The method of claim 11, wherein the auxiliary mixer comprises: a first switch in series with a first capacitor configured to capacitively couple the first end of the RF signal to the second end of the output signal when the first end of the LO signal is asserted; a second switch in series with a second capacitor configured to capacitively couple the second end of the RF signal to the second end of the output signal when the second end of the LO signal is asserted; a third switch in series with a third capacitor configured to capacitively couple the first end of the RF signal to the first end of the output signal when the second end of the LO signal is asserted; and a fourth switch in series with a fourth capacitor configured to capacitively couple the second end of the RF signal to the first end of the output signal when the first end of the LO signal is asserted.

14. The method of claim 11, wherein the first feedback network comprises a parallel connection of a feedback resistor and a feedback capacitor.

15. The method of claim 11, wherein the second feedback network comprises a parallel connection of a feedback resistor and a feedback capacitor.

16. The method of claim 11 further comprising using an integrator configured to receive the output signal and output a filtered signal comprising a first end and a second end, a first feedback resistor configured to provide a feedback from the second end of the filtered signal to the first end of the intermediate signal, and a second feedback resistor configured to provide a feedback from the first end of the filtered signal to the second end of the intermediate signal.

17. The method if claim 16, wherein the integrator comprises another opamp, two feed-in resistors, and two feedback capacitors.

18. The method of claim 11, wherein the LO signal is approximately a square wave of an approximately 25% duty cycle.

19. The method of claim 11, wherein the LO signal is approximately a square wave of an approximately 50% duty cycle.

* * * * *